United States Patent [19]

Suzuki et al.

[11] Patent Number: 4,701,362
[45] Date of Patent: Oct. 20, 1987

[54] DIELECTRIC MATERIAL IN SHEET FORM

[75] Inventors: Hirosuke Suzuki, Tokorozawa; Haruo Imaizumi, Nishi-Asuma, both of Japan

[73] Assignee: Junkosha Co., Ltd., Tokyo, Japan

[21] Appl. No.: 921,122

[22] Filed: Oct. 21, 1986

[30] Foreign Application Priority Data

Nov. 6, 1985 [JP] Japan .......................... 60-170551[U]

[51] Int. Cl.⁴ .......................... B32B 3/10; B32B 27/32
[52] U.S. Cl. ...................................... 428/131; 428/422
[58] Field of Search .................................. 428/131, 422

[56] References Cited

U.S. PATENT DOCUMENTS

| | | | |
|---|---|---|---|
| 3,384,696 | 5/1968 | Makansi | 428/131 |
| 3,953,566 | 4/1976 | Gore | 428/422 |
| 4,559,254 | 12/1985 | Suzuki | 428/131 |

*Primary Examiner*—William J. Van Balen
*Attorney, Agent, or Firm*—Mortenson & Uebler

[57] ABSTRACT

A dielectric sheet material useful in electronics applications is provided. The material preferably is porous, expanded polytetrafluoroethylene (PTFE) having a plurality of through-holes. The walls of the through-holes are solid, sintered PTFE which impart a high degree of compressive strength to the otherwise highly compressible porous PTFE. The through-holes having solid walls may be formed in the material by a laser or by other means.

2 Claims, 2 Drawing Figures

DIELECTRIC MATERIAL IN SHEET FORM

BACKGROUND OF THE INVENTION

The present invention relates to a dielectric material in the shape of a sheet which may be employed in an electric wire, a cable, a printed circuit board and in other electric signal transmission devices.

As a dielectric for electronic machines or devices, an open-cell type oriented porous, expanded polytetrafluoroethylene (PTFE) is known. This material has a relatively low inductivity and is stable both physically and chemically. This type of material can be produced by the method disclosed in the specification of U.S. Pat. No. 3,953,566. This method enables production of a material having a porosity of 90% or more. However, the polymeric material produced by the conventional method is highly compressible and easily collapses and thereby becomes decreased in porosity, resulting in an increase in permittivity. As a result, it is difficult to handle such product.

Accordingly, it is an object of the present invention to provide a sheet-shaped dielectric which is not readily collapsed and has a lowered permittivity.

SUMMARY OF THE INVENTION

A dielectric sheet material of an open cell, continuously porous polymeric material is provided having a plurality of through-holes therethrough, the through-holes having walls, the polymeric material adjacent the walls being substantially solid polymer. The polymeric material is preferably porous, expanded polytetrafluoroethylene.

DETAILED DESCRIPTION OF THE INVENTION AND PREFERRED EMBODIMENTS WITH REFERENCE TO THE DRAWINGS

A dielectric sheet material useful in electronics applications is provided. The material preferably is porous, expanded polytetrafluoroethylene (PTFE) having a plurality of through-holes. The walls of the through-holes are solid, sintered PTFE which impart a high degree of compressive strength to the otherwise high compressible porous PTFE. The through-holes having solid walls may be formed in the material by a laser or by other means.

The present inventors, after exhaustive study of the defects of the prior art, reached the following conclusion: If fused through-holes are provided in an otherwise open-cell type porous material, the solid wall portion of each through-hole defines a reinforcing pillar having increased density as a result of the fusion, and the hollow portion of each through-hole defines a through-bore. It is therefore possible to form reinforcing portions in the open-cell type porous material without substantially increasing the permittivity, so that a material which is not readily compressed is obtained.

The present invention provides a sheet-shaped dielectric material comprising an open-cell type porous material which is provided with a plurality of fused through-holes.

In this arrangement, if open cell porous, expanded polytetrafluoroethylene is employed as the material, it is possible to obtain a stable product, because this resin is stable both physically and chemically and has excellent thermal properties, and therefore the fusion process has no adverse effect on other portions of the material, that is, the open cell structure portions, during the formation of the fused through-holes.

As the means for forming the fused through-holes, it is possible to employ various kinds of heat rays, light rays, or pressure fitting of high-temperature, rod-like members.

According to the present invention, a plurality of fused through-holes are formed in an otherwise open cell porous material. The wall of each fused through-hole defines a solid reinforcing pillar, and the material is studded with a plurality of such fused through-holes, so that a dielectric sheet is formed which is not readily compressed. In addition, the through-holes also function as pores, and each portion of the open cell porous material between the through-holes remains in its initial state. As a consequence, there is substantially no increase in permittivity of the material.

Figure 1:
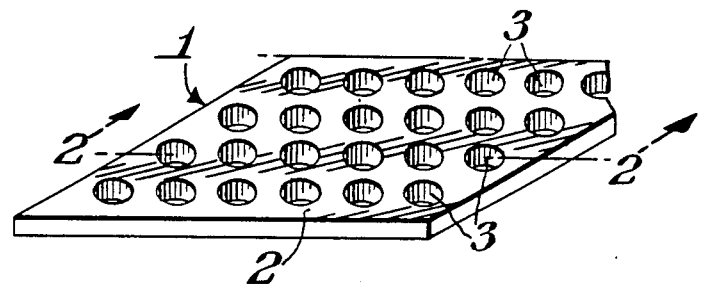
FIG. 1 is a fragmentary perspective view of the dielectric sheet material according to the invention.

Referring to the accompanying drawings, FIG. 1 is a fragmentary perspective view of a sheet-shaped dielectric 1 according to the present invention. In the figure, the sheet-shaped dielectric 1 is formed by providing a plurality of fused through-holes 3 in an open cell porous material 2.

Figure 2:
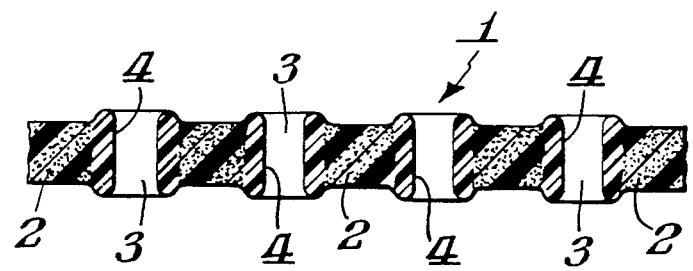
FIG. 2 is an enlarged cross-sectional view of the sheet take substantially along line 2—2 of FIG. 1.

As shown in FIG. 2, which is an enlarged view, each fused through-hole 3 has a reinforcing solid wall 4 formed over the entire length of the through-hole 3, the wall being defined by a portion of the material which is solidified by heat fusion.

Thus, in the sheet-shaped dielectric 1 according to the present invention, the reinforcing solid walls 4 of a multiplicity of fused through-holes 3 provided in the open cell porous material 2 respectively define solid reinforcing pillars which are distributively disposed throughout the sheet, and the reinforcing pillars individually support a compressive stress. Accordingly, it becomes extremely difficult for the sheet-shaped dielectric 1 to be compressed, and the permittivity thereof is lowered, advantageously.

According to the present invention, a sheet-shaped dielectric is formed by providing a plurality of fused through-holes in an otherwise open cell porous material. Therefore, reinforcing solid walls are respectively formed in the fused through-holes, and the sheet-shaped dielectric is not readily compressed. As a result, the open cell structure of the initial material is substantially maintained, and each through-hole defines a pore having a relatively large opening. Accordingly, it is possible to provide a sheet-shaped dielectric when it is not readily compressed and which has stable properties and reduced permittivity.

While the invention has been disclosed herein in connection with certain embodiments and detailed descriptions, it will be clear to one skilled in the art that modifications or variations of such details can be made without deviating from the gist of this invention, and such modifications or variations are considered to be within the scope of the claims hereinbelow.

What is claimed is:

1. A dielectric sheet material of an open cell, continuously porous polymeric material having a plurality of through-holes therethrough, said through-holes having walls, the polymeric material adjacent said walls being substantially solid polymer in the form of highly compression resistant solid pillars.

2. The dielectric sheet of claim 1 wherein said polymeric material is porous, expanded polytetrafluoroethylene.

* * * * *